(12) United States Patent
Mei et al.

(10) Patent No.: US 7,385,429 B1
(45) Date of Patent: Jun. 10, 2008

(54) CHARGE PUMP WITH REDUCED CURRENT MISMATCH

(75) Inventors: Haitao Mei, Kanata (CA); Shoujun Wang, Kanata (CA); William Bereza, Nepean (CA); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 11/142,880

(22) Filed: May 31, 2005

(51) Int. Cl.
*H03L 7/06* (2006.01)

(52) U.S. Cl. .................. 327/157; 327/148; 327/158

(58) Field of Classification Search .............. 327/147, 327/148, 156, 157, 158, 538, 543; 323/315, 323/317
See application file for complete search history.

(56) References Cited

U.S. PATENT DOCUMENTS

| | | | | |
|---|---|---|---|---|
| 5,608,348 A * | 3/1997 | Kearney et al. | ............ | 327/538 |
| 5,760,640 A * | 6/1998 | Girard et al. | ............... | 327/543 |
| 5,952,869 A * | 9/1999 | Fattori et al. | ............... | 327/404 |
| 6,094,078 A * | 7/2000 | Suzuki | ...................... | 327/156 |
| 6,404,276 B1 * | 6/2002 | Liu | .......................... | 327/553 |
| 6,526,111 B1 * | 2/2003 | Prasad | ...................... | 375/376 |
| 6,545,540 B1 * | 4/2003 | Enriquez | ................... | 330/288 |
| 6,639,475 B2 * | 10/2003 | Ichimaru | .................... | 331/17 |
| 6,774,730 B2 * | 8/2004 | Gasparik | .................... | 331/17 |
| 6,778,026 B2 * | 8/2004 | Cheah et al. | ................ | 331/17 |
| 6,924,678 B2 * | 8/2005 | Starr | ......................... | 327/147 |
| 6,952,126 B2 * | 10/2005 | Byun et al. | ................. | 327/157 |
| 7,012,473 B1 * | 3/2006 | Kokolakis | ................... | 331/17 |
| 7,042,302 B2 * | 5/2006 | Chien | ......................... | 331/185 |
| 7,053,684 B1 * | 5/2006 | Sen et al. | .................... | 327/157 |
| 7,161,401 B2 * | 1/2007 | Li | ............................... | 327/157 |
| 2005/0068075 A1 * | 3/2005 | Innocent | ..................... | 327/157 |
| 2005/0185746 A1 * | 8/2005 | Jung | .......................... | 375/374 |
| 2005/0253634 A1 * | 11/2005 | Wu | ............................. | 327/157 |

OTHER PUBLICATIONS

Jae-Shin Lee et al., "Charge Pump With Perfect Current Matching Characteristics in Phase-Locked Loops", Electronics Letters, vol. 36, No. 23, pp. 1907-1908 (Nov. 9, 2000).

Ian A. Young et al. "A PLL Clock Generator with 5 to 110 MHz of Lock Range for Microprocessors", IEEE J. Solid State Circuits, vol. 27, No. 11, pp. 1599-1607 (1992).

\* cited by examiner

*Primary Examiner*—Kenneth B. Wells
*Assistant Examiner*—William Hernandez
(74) *Attorney, Agent, or Firm*—Treyz Law Group; G. Victor Treyz

(57) ABSTRACT

Charge pump circuitry is provided that is insensitive to charge sharing and current mismatch effects. The charge pump circuitry has an output node at which a charge pump output voltage is provided. A first current source charges the output node to increase the output voltage or a second current source discharge the output node to decrease the output voltage. The charge pump circuitry uses a unit-gain op-amp circuit to prevent charge sharing effects from affecting the output voltage when switching between discharging and charging operations. A low-pass filter is used to reduce feedback noise on the output node. A replica feedback circuit prevents current mismatch between the currents produced by the first and second current sources. The first and second current sources may be formed using programmable transistors that are adjusted by static control signals provided by programmable elements to further minimize current mismatch.

13 Claims, 8 Drawing Sheets

CHARGE PUMP WITH REDUCED CURRENT MISMATCH

BACKGROUND

This invention relates to charge pump circuits, and more particularly, to charge pump circuits having current matching, non-startup prevention, and programmable current steering capabilities.

Charge pumps are used in circuits such as phase-locked loops in clock and data recovery circuits. Accurate charge pump behavior is important to ensure optimum performance of the phase-locked loop.

Charge sharing effects and current mismatch effects adversely affect charge pump performance. These effects reduce the accuracy of conventional charge pumps and the circuits in which these conventional charge pumps operate.

SUMMARY

In accordance with the present invention, charge pump circuitry is provided that is insensitive to charge sharing and current mismatch effects.

The charge pump circuitry has a charge pump core and replica feedback circuitry. The charge pump core has inputs that receive charge pump control signals and an output node at which a charge pump output voltage is provided in response to the charge pump control signals.

The charge pump core has first and second current sources. The first current source is coupled between a positive power supply voltage and the output node. The second current source is coupled between the output node and a ground power supply voltage. The charge pump core has two parallel circuit branches that are coupled by a unit-gain operational amplifier. The parallel circuit branches each include transistors such as metal-oxide-semiconductor transistors having gates controlled by the charge pump control signals. By turning on and off the transistors in the charge pump core, the charge pump control signals control whether the first current source is charging the output node or whether the second current source is discharging the output node.

When the output node is charged, the output voltage on the output node rises toward a high voltage. When the output node is discharged, the output voltage is lowered toward a low voltage. The unit-gain operation amplifier couples the first and second branches and ensures that the output node does not suffer from charge sharing effects as the control signals switch the charge pump circuitry between discharging and charging modes.

The replica feedback circuitry provides feedback signals that ensure that the currents produced by the first and second current sources do not become mismatched. Second-order current mismatch effects are also minimized by using programmable transistors in the first and second current sources. The strengths of the programmable transistors can be adjusted by loading appropriate configuration data into programmable elements on the integrated circuit on which the charge pump circuitry is implemented. The programmable elements produce corresponding static control signals that are applied to respective transistor stages in the programmable transistors. The static control signals connect and disconnect portions of the programmable transistors to adjust their strengths. By balancing the strengths of the first and second current sources, current mismatch is reduced.

The charge pump circuitry contains a feedback path from the output node through the first current source and back to the output node. To reduce noise coupling, particularly at high frequencies, low-pass filter circuitry is interposed in the feedback path.

The replica feedback circuitry contains an operational amplifier in a two-stage configuration. The operational amplifier contains a metal-oxide-semiconductor transistor characterized by a threshold voltage. The gate of the transistor is connected to the output node. To prevent the voltage of the output node from becoming stuck when the output voltage is lower than the threshold voltage, a static current source is used to contribute a small current to the total current produced by the first current source. Even if the voltage on the output node is low and the operational amplifier in the replica feedback circuitry is not active because the threshold voltage of the transistor has not been exceeded, the static current source will charge the output node and raise its voltage.

Further features of the invention, its nature and various advantages will be more apparent from the accompanying drawings and the following detailed description of the preferred embodiments.

DETAILED DESCRIPTION

The present invention relates to charge pumps and to methods for using charge pumps. The charge pump circuitry of the present invention may be used in integrated circuits such as programmable logic device integrated circuits.

Programmable logic devices are integrated circuits that can be configured by a user to perform custom logic functions. Programmable logic devices are configured ("programmed") by loading configuration data into the device. The configuration data selectively turns on and off components of the device's circuitry and thereby customizes the logic on the device. Programmable logic devices with non-volatile configuration memory retain their configuration data when power is removed. Programmable logic devices with volatile configuration data are typically loaded with configuration data on system power-up using an ancillary circuit called a configuration device. The configuration device may store the configuration data using non-volatile memory.

Programmable logic devices with non-volatile memory can also be configured after installation in a system (so-called in-system programming).

The present invention may be used in the context of any suitable integrated circuit, but is described in the context of programmable integrated circuits such as programmable logic devices for clarity.

Integrated circuits such as programmable logic devices often use charge pumps. For example, integrated circuits often have communications circuitry for supporting data communications links with other integrated circuits. The communications circuitry may include clock and data recovery circuitry that extracts an embedded clock signal and data from data signals received from another integrated circuit. Clock-and-data recovery circuits use phase-locked loops. A charge pump is part of a phase-locked loop circuit.

Figure 1:
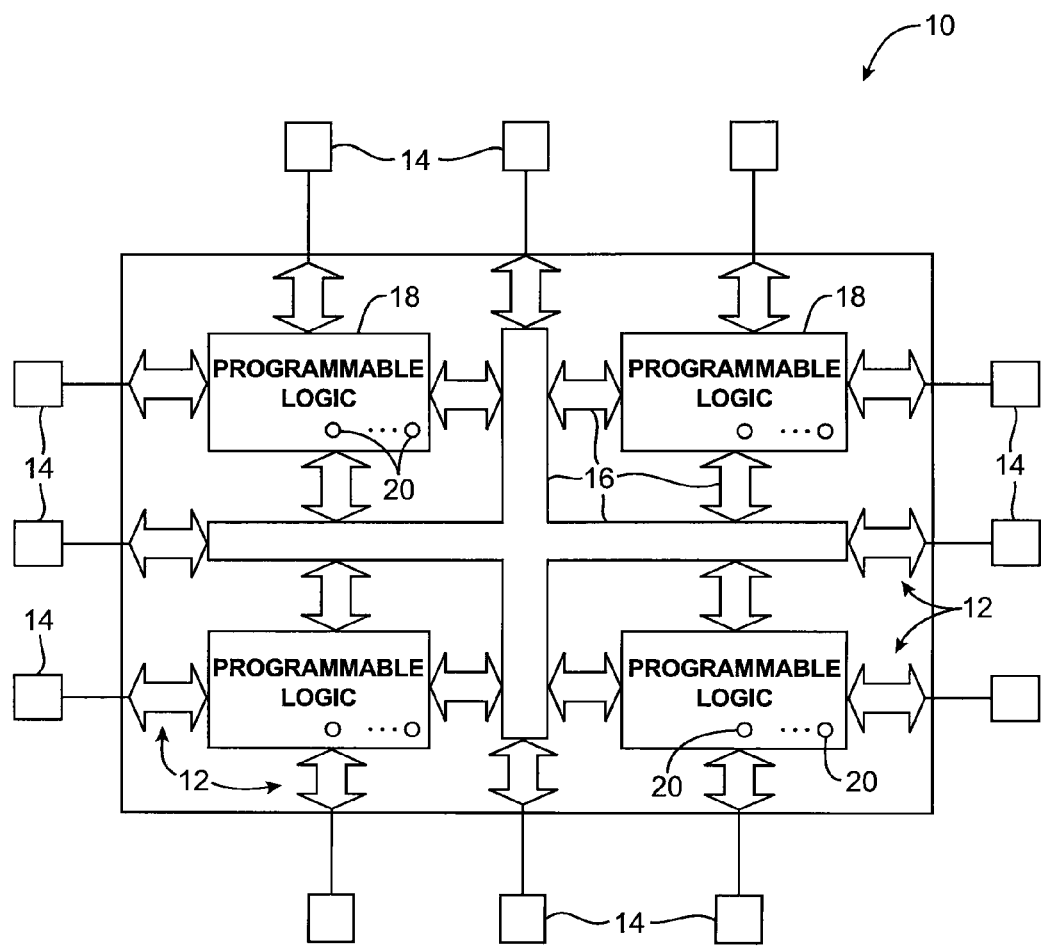
FIG. 1 is a diagram of an illustrative programmable logic device in accordance with the present invention.

An illustrative programmable logic device 10 of the type that may contain a charge pump is shown in FIG. 1.

Programmable logic device 10 may have input-output circuitry 12 for driving signals off of device 10 and for receiving signals from other devices via input-output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements in the programmable logic device 10 using pins 14 and input/output circuitry 12. During normal operation of device 10, the programmable elements (also sometimes called configuration bits or configuration memory) each provide a static control output signal that controls the state of an associated logic component in the programmable logic of circuitry 18.

In a typical volatile memory arrangement, the programmable elements may be random-access memory (RAM) cells that are loaded from an external configuration device integrated circuit via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The programmable circuitry that is configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from electrically-configured fuses or electrically-configured antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, programmable logic devices with programmable elements made from phase-change materials, mask-programmed devices, etc. Illustrative programmable logic elements are shown schematically as elements 20 in FIG. 1.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired wireless circuitry may be used to receive wirelessly-transmitted configuration data. Other hardwired communications circuitry and digital signal processing circuitry (e.g., multipliers, adders, etc.) may also be used.

Figure 2:
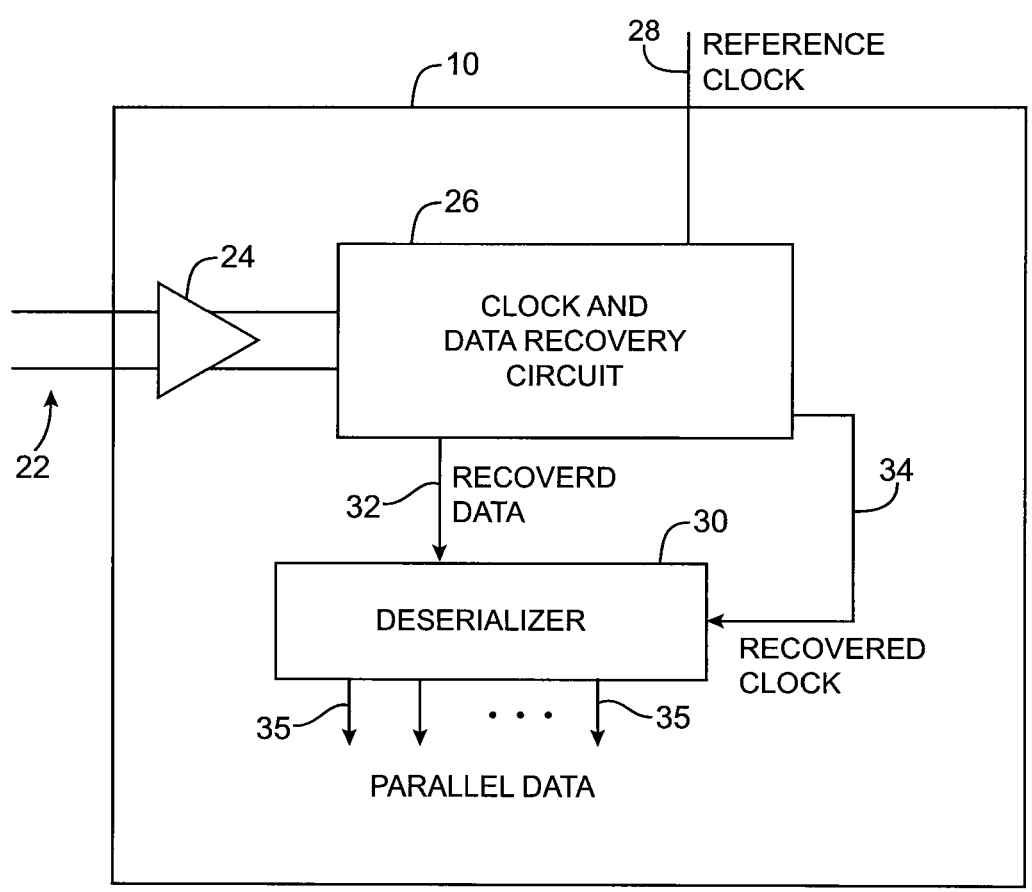
FIG. 2 is a diagram of illustrative clock and data recovery circuitry in an integrated circuit such as a programmable logic device integrated circuit in accordance with the present invention.

Programmable logic device 10 may transmit and receive data though its I/O circuitry 12. For example, programmable logic device 10 may receive data from another integrated circuit over a communications path 22, as shown in FIG. 2. Path 22 may be connected to the differential inputs of a differential input buffer 24. The outputs of differential input buffer 24 may be connected to a clock-and-data recovery circuit 26.

Communications link 22 of FIG. 2 may be a high-speed differential data link in which differential data is conveyed over a pair of associated signal lines. The lines in link 22 may include conductive traces such as lines on one or more circuit boards, cables, system backplane busses, etc.

The integrated circuit from which the data on link 22 is transmitted may have a transmitter that serializes data and that embeds a clock into the signal. The data with the embedded clock may be transmitted to programmable logic device 10 over link 22.

The embedded clock signal may be generated from a known reference clock that is received at terminal 28. The reference clock may be generated by an oscillator on a circuit board on which device 10 is mounted. The serial data may be encoded using any suitable format. For example, the data may be non-return-to-zero (NZR) data.

The programmable logic device 10 may receive the differential data signals from lines 22 using a differential input buffer 24. Input buffer 24 strengthens and level shifts the differential data. At the output of the input buffer 24, the differential data signals have the appropriate high and low logic levels for processing by the digital circuitry on device 10.

The output signals from input buffer 24 are received by a clock and data recovery circuit 26. Clock and data recovery circuit 26 also receives the reference clock at input 28.

The clock and data recovery circuit 26 may have a phase-locked loop that locks onto the reference clock. Once the clock and data recovery circuit 26 has acquired the reference clock, the clock and data recovery circuit may be used to extract the embedded clock. The recovered embedded clock may be used to recover the data from the data stream.

The clock and data recovery circuit 26 may pass the recovered data and recovered clock to a deserializer 30 over data path 32 and recovered clock path 34. The deserializer 30 may use the recovered clock to convert the recovered data into a parallel data format. The parallel data may be provided to other circuitry on programmable logic device 10 on parallel output lines 35.

Figure 3:
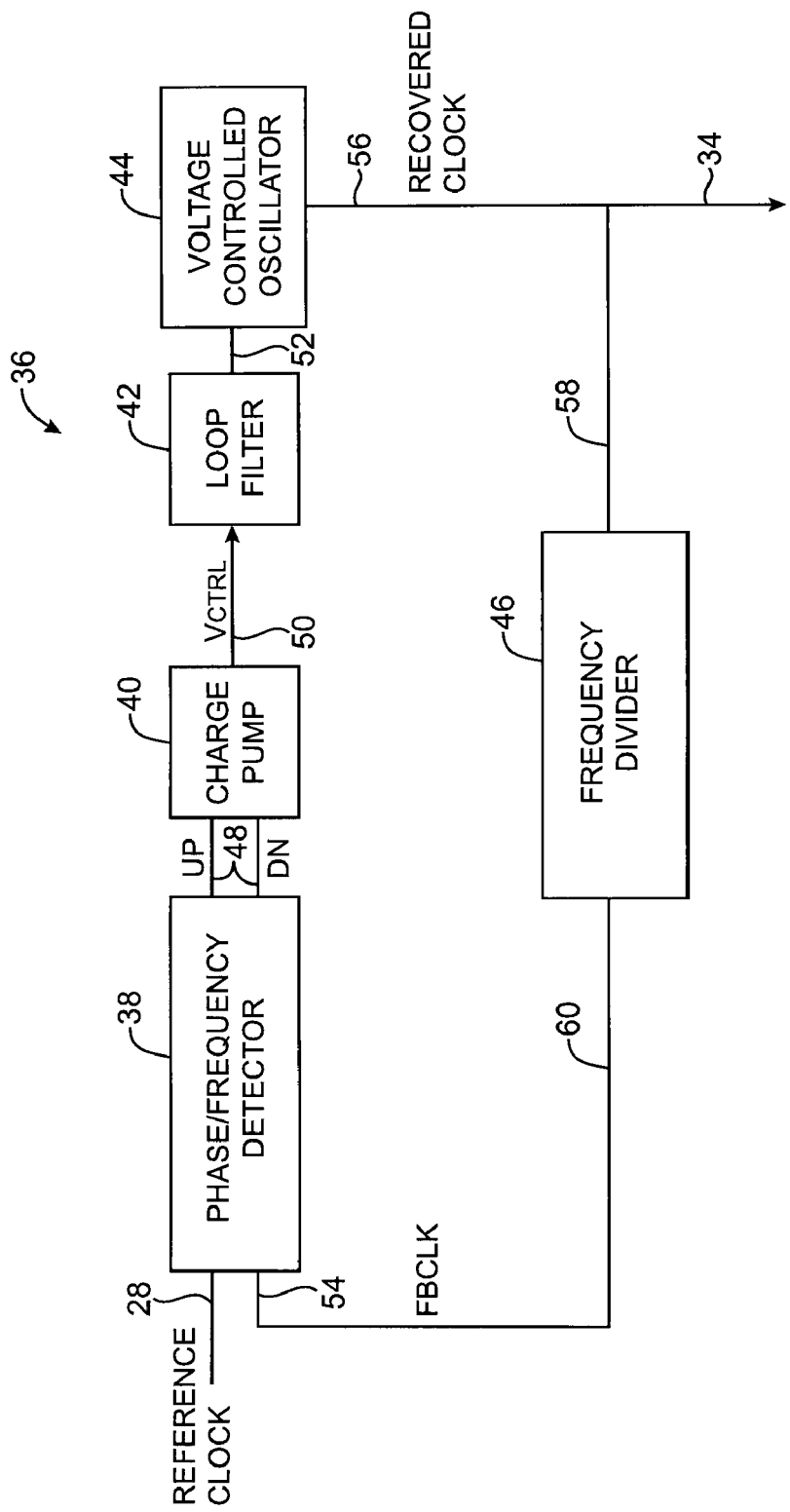
FIG. 3 is a diagram of a illustrative phase-locked loop using a charge pump in accordance with the present invention.

An illustrative phase-locked-loop 36 that may be used in circuits such as clock and data recovery circuit 26 of FIG. 2 is shown in FIG. 3. Phase-locked loop 36 is formed by phase/frequency detector 38, charge pump 40, loop filter 42, voltage controlled oscillator 44, and frequency divider 46. In this example, phase-locked loop 36 is being used to lock to the reference clock on line 28 and provides the recovered clock on line 34.

Phase/frequency detector 38 compares the reference clock provided to reference clock input 28 to a feedback clock FBCLK from the voltage-controlled oscillator 44 at input 54. The phase/frequency detector 38 provides output signals UP and DN on its outputs 48. When the reference clock is ahead of the FBCLK, the control signals UP and DN have a first state. When the reference clock is behind FBCLK, the UP and DN signals are placed in a second state. The phase/frequency detector outputs UP and DN therefore act as control signals for the rest of the phase-locked loop. These control signals are used to adjust the frequency of the feedback signal produced by the voltage-controlled oscillator 44 so that it matches the reference clock.

The output signals UP and DN from the phase/frequency detector 38 are provided to the inputs of charge pump 40. The charge pump 40 produces an analog output signal $V_{CTRL}$ that is proportional to the incoming control signals UP and DN. This signal is provided to loop filter 42 over path 50. Loop filter 50 filters this signal to remove undesirable frequency components and provides the filtered version of the signal to voltage-controlled oscillator 44 as an input over line 52. Voltage-controlled oscillator 44 produces an output signal whose frequency is proportional to the voltage on line 52. The output signal from the voltage-controlled oscillator 44 may be fed back to input 54 of the phase/frequency detector 38 via paths 56, 58, and 60. An optional frequency divider 46 may be used in this feedback path if desired.

The performance of circuit 36 and other circuits that rely on charge pumps such as charge pump 40 is affected directly by the accuracy of charge pump 40. If charge pump 40 exhibits non-ideal behavior, the performance of circuit 36 will suffer.

Figure 4:
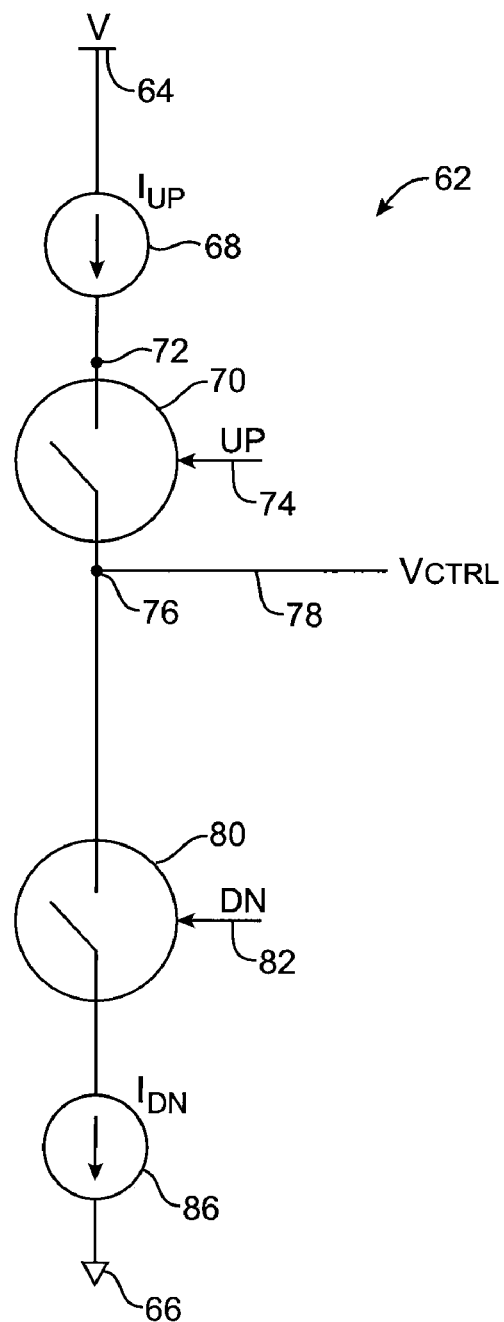
FIG. 4 is a diagram of a charge pump circuit of the type that is subject to the adverse effects of charge sharing.

One source of problems in charge pump performance is the so-called charge sharing effect. A charge pump circuit 62 of the type that is strongly influenced by charge sharing effects is shown in FIG. 4. The charge pump circuit 62 of FIG. 4 has two current sources 68 and 86. Current source 68 supplies a current of $I_{UP}$ and current source 86 supplies a current of $I_{DN}$. For the purposes of this charge sharing discussion, assume $I_{UP}=I_{DN}$. The current sources are connected between a positive power supply node 64 at voltage V and a ground terminal 66 at ground.

The output of charge pump 62 is the voltage control signal $V_{CTRL}$ supplied at line 78. Line 78 is connected to node 76, which lies between switch 70 and switch 80. Switch 70 is controlled by the UP control signal applied to control input 74. Switch 80 is controlled by the DN control signal applied to control input 82. When circuit 62 is used in a phase-locked loop such as loop 36 of FIG. 3, the UP and DN signals are produced by the output of a phase/frequency detector such as phase/frequency detector 38.

In one mode, the UP and DN signals direct switch 70 to open and switch 80 to close. Because switch 80 is closed, the current source 86 is electrically connected to node 76 through a low-resistance path and removes charge from node 76 so that voltage $V_{CTRL}$ drops.

While switch 70 is open, charge is building at node 72. When it becomes time for the mode of operation of circuit 62 to change, the UP and DN signals change state. In this situation, switch 70 is closed and switch 80 is open. At the moment switch 70 is closed, the charge that has been stored on node 72 is "shared" with the charge on the node 76, disrupting the control voltage $V_{CTRL}$ and thereby introducing error into the operation of the charge pump circuit 62.

Figure 5:
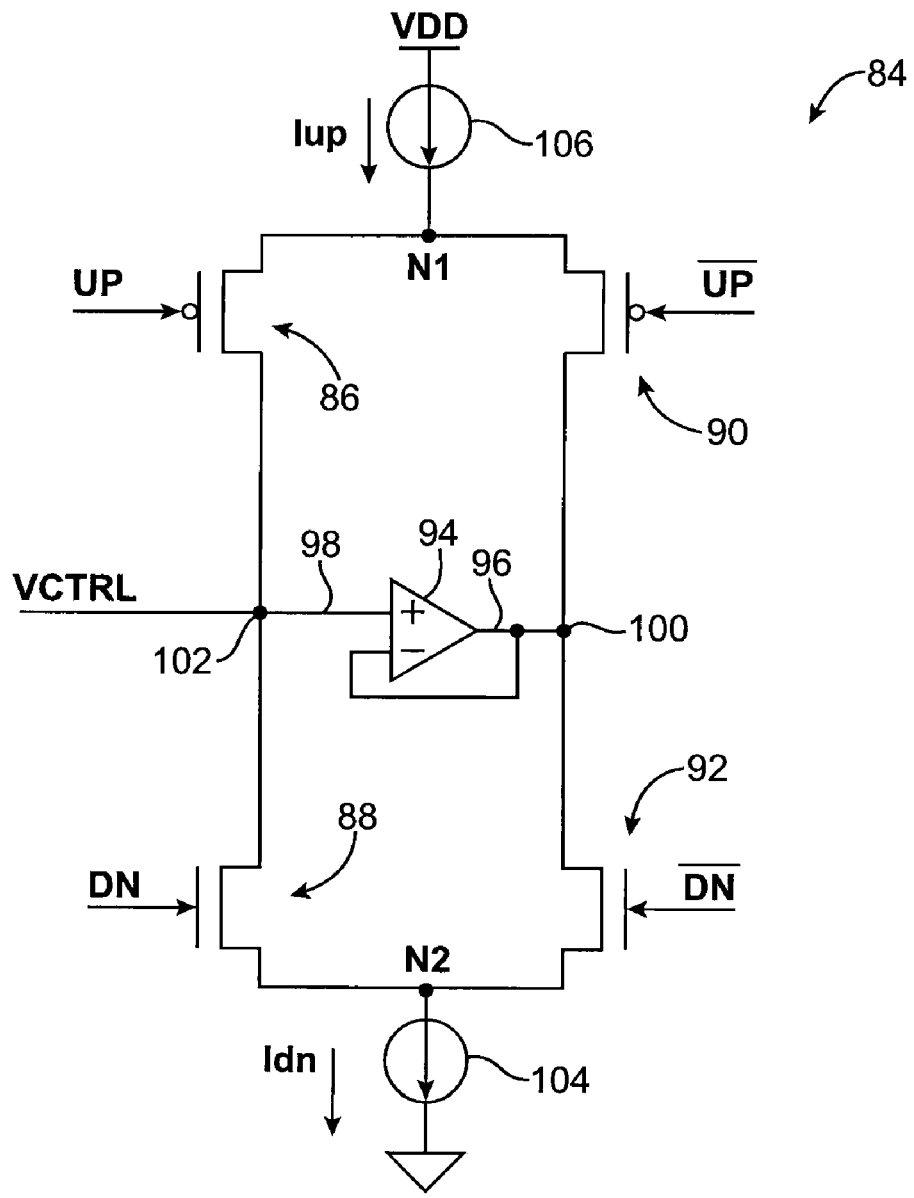
FIG. 5 is a diagram of charge pump circuitry that addresses charge sharing effects.

The charge pump circuit of the present invention introduces circuitry to compensate for charge sharing effects. A portion of a charge pump circuit that compensates for charge sharing is shown in FIG. 5. In charge pump circuitry 84, the switching functions of switches 70 and 80 of FIG. 4 are performed by metal-oxide-semiconductor (MOS) transistors. Transistors 86 and 88 in the left-hand branch of circuitry 84, serve functions similar to those of switches 70 and 80 of FIG. 4. Parallel transistors 90 and 92 in the right-hand branch of circuitry 84 and op-amp 94 are used to compensate for charge sharing effects.

Transistors 88 and 92 are n-channel MOS (NMOS) transistors. Transistors 86 and 90 are p-channel MOS (PMOS) transistors. Transistors 88 and 92 are on when a "1" is applied to their gates. Transistors 86 and 90 are turned on when a "0" is applied to their gates.

Transistor 88 is driven by the DN signal applied to its gate. An UP signal controls transistor 86. Transistors 90 and 92 are controlled respectively by NOT UP and NOT DN signals (i.e., the complements of signals UP and DN used to control transistors 86 and 88).

Op-amp 94 is connected in a unit gain buffer configuration between nodes 100 and 102. In this configuration, the gain of op-amp 94 is one and its output 96 is always equal to its input 98.

The way in which charge sharing effects are compensated by the arrangement of FIG. 5 can be understood by an example. Consider the situation in which UP=1, NOT UP=0, DN=1 and NOT DN=0. In this situation, PMOS transistor 86 is off and transistor 88 is on, so $V_{CTRL}$ drops due to the discharging effect produced by the current $I_{DN}$ from source 104. PMOS transistor 90 is on, so node N1 is at the same potential as node 100 at the output of op-amp 94. The presence of op-amp 94 ensures that node 100 and therefore node N1 is equal to $V_{CTRL}$. When the state of the pump circuitry changes to UP=0, NOT UP=1, DN=0 and NOT DN=1, transistor 86 turns on and charges $V_{CTRL}$ up. Because the voltage at N1 was maintained at $V_{CTRL}$ prior to the change in mode through the operation of op-amp 94, node N1 does not share charge with the $V_{CTRL}$ node when the mode changes.

Another non-ideal charge pump characteristic that is addressed by the charge pump circuitry of the present invention is the so-called current matching effect. For proper operation of a circuit such as circuit 84 of FIG. 5, the current $I_{DN}$ that is produced by source 104 should exactly match the current $I_{UP}$ that is produced by source 106 for all input signals UP and DN and all output voltages $V_{CTRL}$. If the currents $I_{DN}$ and $I_{UP}$ are not always equal, the charge on node 102 and therefore the voltage $V_{CTRL}$ on node 102 will either rise faster or slower than expected, leading to non-linear behavior.

Consider, for example, the situation in which current sources 106 and 104 are formed by MOS transistors. As the voltage $V_{CTRL}$ changes due to changes in the UP and DN control signals, the drain-to-source voltage drop $V_{DS}$ in these MOS transistors changes. In particular, as $V_{CTRL}$ rises, $V_{DS}$ for the $I_{UP}$ source will drop and $V_{DS}$ for the $I_{DN}$ source will rise, causing $I_{UP}$ to become smaller than $I_{DN}$. As this demonstrates, the circuitry of the charge pump must be tolerant to changes in drive signals and output voltage. If the circuitry of the charge pump is too sensitive, the currents $I_{DN}$ and $I_{UP}$ will become unequal easily, which will make the performance of charge pump circuitry 84 non-linear and inaccurate.

Figure 6:
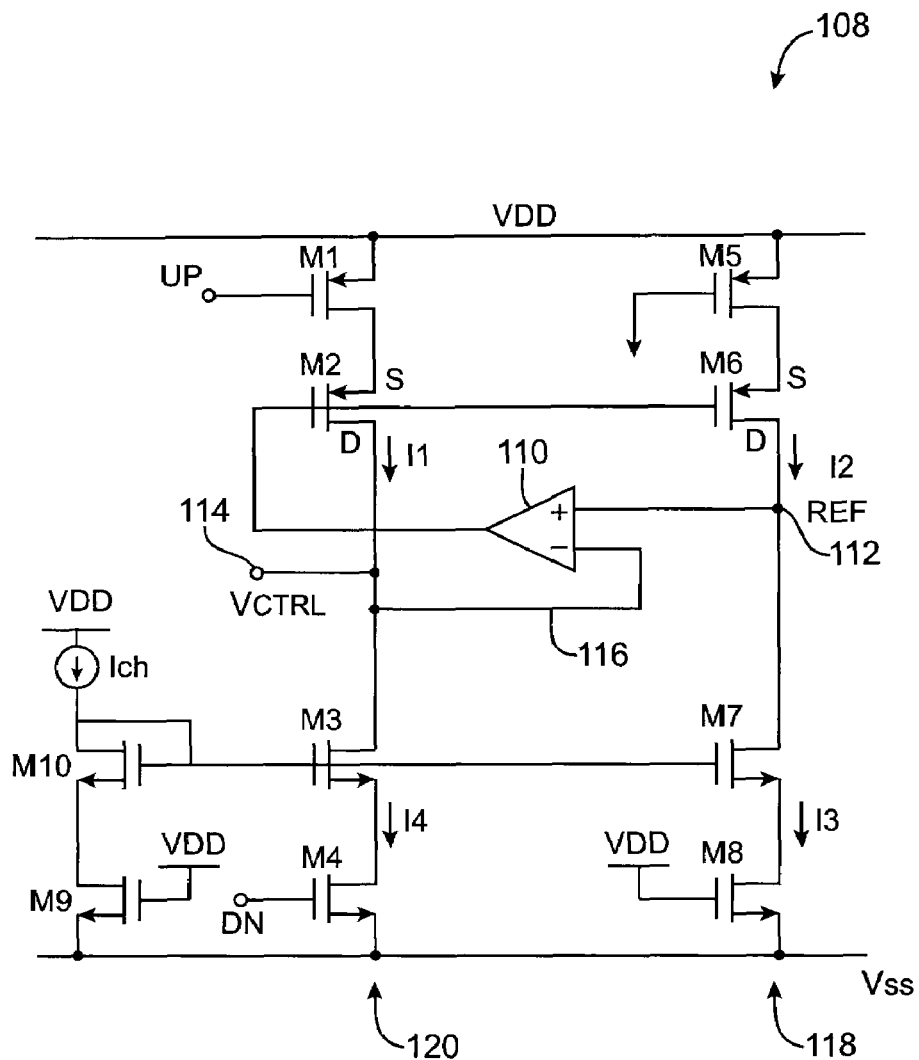
FIG. 6 is a diagram of charge pump circuitry that addresses current matching effects.

A conventional charge pump circuit 108 that contains features for addressing the current matching problem is shown in FIG. 6. In circuitry 108 of FIG. 6, control signals UP and DN are applied to the gates of transistor M1 and transistor M4, respectively. Op-amp 110 drives the gates of transistors M2 and M6 and is connected in a so-called two-stage op-amp configuration (line 116 forms a negative feedback path). Because of the two-stage op-amp configuration, the voltage REF on node 112 follows the voltage $V_{CTRL}$ on node 114. This effectively couples the left and right halves of circuit 108.

The charge pump circuit 108 of FIG. 6 operates in charging and discharging modes.

In charging mode, UP=0 and DN=0. In this situation, PMOS transistors M1 and M5 are on and the source voltages of transistors M2 and M6 are at identical voltages. The drain of M2 is at $V_{CTRL}$ and the drain of transistor M6 is at voltage REF. Because of op-amp 110, the voltage REF and $V_{CTRL}$ are equal, so the drains of M2 and M6 are at equal voltages. As shown in FIG. 6, the gates of M2 and M6 are also connected to the same potential. By symmetry, the current $I_1$ through transistor M2 and the current $I_2$ through transistor M6 are equal. The current $I_2$ and $I_3$ are equal, because they lie in the same branch of the circuit. As a result, $I_1=I_2=I_3$.

Current $I_3$ is produced by a current mirror circuit. This current mirror is formed from reference current source Ich and transistors M10 and M7. Transistor M7 lies in the right-hand branch 118 of circuit 108. A similar current mirror for the left-hand branch 120 of circuit 108 is formed from source Ich and transistors M10 and M3. The current Ich is produced by a current mirror reference current source. The ratios of the strengths of transistors M3, M7, and M10 set the ratios of the current mirrors. The ratio of M3 to M10 determines the ratio of current $I_4$ to reference current Ich. The ratio of M7 to M10 determines the ratio of current $I_3$ to Ich. Because $I_3$ is produced by a current mirror, the value of $I_1=I_3$ is also controlled by Ich and the M10/M7 ratio. Thus, the value of current source $I_1$ is not a function of $V_{CTRL}$ and is always equal to $I_3$, which is set by the reference current Ich.

In discharging mode, DN=1 and UP=1. In this situation, M3, M7, M4, M8, M9, M10, and source Ich form current mirror circuits. The ratio of M3/M10 determines the ratio of $I_4$/Ich. The ratio M7/M10 determines the ratio of $I_3$/Ich.

Transistor M1 is off during discharging, so $I_1$ is low. The value of $I_2$ does not affect the performance of the circuit. Transistors M3 and M4 are on and the magnitude of current $I_4$ is controlled by Ich and the ratio of M10/M3. Transistors M7 and M3 are identical, so $I_4$ will match $I_3$ (provided that M4 is on as it is during discharging), regardless of the magnitude of $V_{CTRL}$.

The magnitude of $V_{CTRL}$ during charging and discharging affects the size of $I_3$. For example, at low $V_{CTRL}$ values, the value of $I_3$ might be 10 microamps, whereas at higher $V_{CTRL}$ values, the value of $I_3$ might be 15 microamps. Although the magnitude of $I_3$ is not fixed as a function of $V_{CTRL}$, circuit 108 ensures that $I_1=I_4$ for all $V_{CTRL}$. During charging mode when current $I_1$ charges node 114 and causes $V_{CTRL}$ to rise, $I_1$ is set to $I_3$. Similarly, during discharging mode when current $I_4$ discharges node 114 and causes $V_{CTRL}$ to fall, $I_4$ is set to $I_3$. This ensures that $I_1=I_4$ for all $V_{CTRL}$, thereby addressing the charge pump current mismatch problem.

Figure 7:
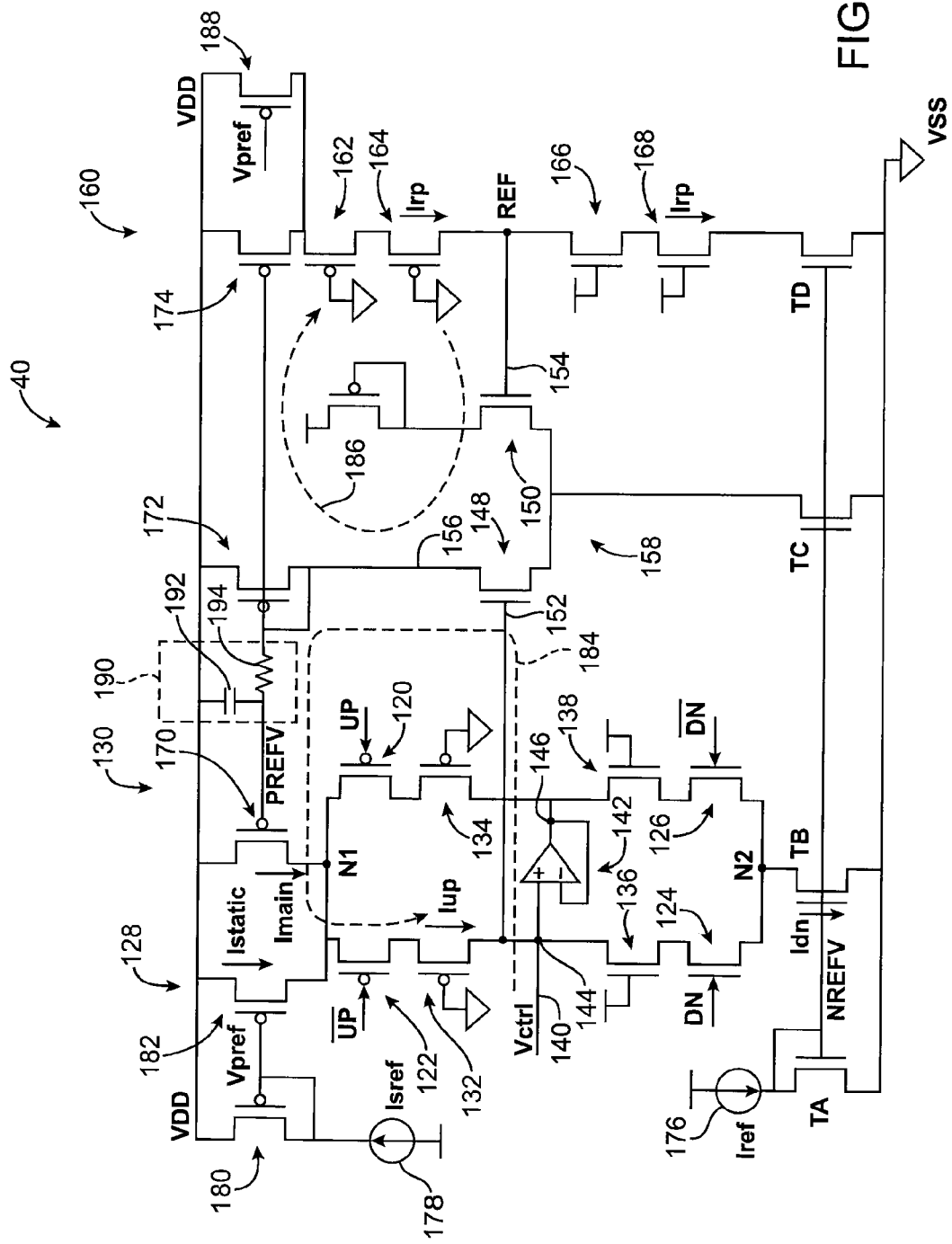
FIG. 7 is a diagram of illustrative charge pump circuitry that addresses charge sharing and current matching effects in accordance with the present invention.

FIG. 7 shows a charge pump 40 in accordance with the present invention. Charge pump 40 of FIG. 7 may be used in phase-locked loops such as loop 36 of FIG. 3 or in other suitable circuits. The charge pump 40 has features that address both charge sharing and current matching issues.

Charge pump 40 is powered by a positive power supply voltage $V_{DD}$ and a ground power supply voltage $V_{SS}$. Control signals UP, NOT UP, DN, and NOT DN are applied to charge pump 40 (e.g., from the output of a phase-frequency detector such as phase-frequency detector 38 of FIG. 3) at the gate terminals of transistors 120, 122, 124, and 126, respectively. In the example of FIG. 3, phase-frequency detector 38 is shown as producing UP and DN signals. When driving charge pump circuit 40 of FIG. 7, the complements of these signals (NOT UP and NOT DN) are produced by including inverters in the output stage of phase-frequency detector 38. In general, the polarity of signals such as UP and DN is not critical and can be configured in any suitable way by selective use of inverters and NMOS and PMOS transistors in the charge pump and/or external circuits such as phase-frequency detector 38.

In the example of FIG. 7, transistors 122 and 120 are PMOS transistors and transistors 124 and 126 are NMOS transistors. When the gates of transistors 120 and 122 are high, transistors 120 and 122 are off. When the gates of transistors 120 and 122 are low, transistor 120 and 122 are on. Transistors 124 and 126 are turned off by low signals on their gates and are turned on by high signals on their gates. Transistors 132, 134, 136, and 138 are biased in an always on configuration and serve as isolation transistors. The gate-drain capacitance $C_{GD}$ of these transistors will allow high frequency signals (e.g., high frequency NOT UP signals) to pass to charge pump output line 140.

The left-hand portion of charge pump 40 is called the charge pump core and includes two parallel branches 128 and 130. Circuit branch 128 includes transistors 122 and 124. Circuit branch 130 includes transistors 120 and 126. These two branches are coupled by an op-amp 142. Op-amp 142 is connected in a unit gain buffer configuration between nodes 144 and 146. In this configuration, the gain of op-amp 142 is one and its output at node 146 is always equal to its input at node 144. As described in connection with circuit 84 of FIG. 5, this ensures that node 140 will not be subjected to charge sharing effects from node N1 when pump 40 switches between discharging and charging modes.

The right-hand portion of charge pump 40 forms a replica feedback circuit. The replica feedback circuit provides feedback signals to the charge pump core that minimize current mismatch between the Idn current source formed from transistor TB and the Iup current source formed using transistors 170 and 128. Transistors 148 and 150 in the replica feedback circuitry form an operational amplifier (op-amp) 158 having inputs 152 and 154 and an output 156. The transistors of op-amp 158 are MOS transistors that are characterized by a threshold voltage Vth. Op-amp 158 is connected in a two-stage configuration and couples the circuitry of branches 128 and 130 to circuit branch 160. The output 156 of op-amp 158 provides feedback to the charge pump core and is coupled to the gates of PMOS transistors 170 and 174, which ties together the operation of these transistors in the same way as transistors M2 and M6 of FIG. 6.

Replica feedback circuit portion 160 includes four transistors 162, 164, 166, and 168 that match the four-transistor arrangements of branches 128 and 130 (e.g., by matching transistors 122, 132, 136, and 124 in branch 128).

Circuitry 160 includes transistor TD, which forms a current mirror with transistor TA and the Iref current source 176. Transistors TB and TC form current mirrors with source 176 and transistor TA. Op-amp 158 causes the voltage at the REF node to follow the voltage $V_{CTRL}$, so that the condition in which Iup=Irp=Idn is achieved, as described in connection with $I_1$, $I_3$, and $I_4$ of FIG. 6. This makes Iup=Idn to minimize current mismatch. The replica feedback arrangement of circuit 40 therefore ensures that the discharging current and the charging current for the charge pump core are the same, thereby overcoming potential current matching problems.

In discharging mode, DN is 1 and UP is 0. NOT DN is $0_o$ and NOT UP is 1. In this mode, the discharging current Idn is controlled by Iref, because of the current mirror formed by transistors TA and TB. Note that there is always an Idn current, so long as the DN control signal is high.

In charging mode, UP is 1, NOT UP is 0, DN is 0, and NOT DN is 1. In this situation, the charging current Iup for the charge pump core is Iup=Irp (i.e., the charging current is tied to the reference current Irp of branch 160, as described in connection with currents $I_1$ and $I_3$ in FIG. 6).

Unlike the Idn current, the charging current Iup that is produced using transistor 170 can only be provided properly if the voltage $V_{CTRL}$ on node 144 is greater than the threshold voltage Vth of transistor 148. This is because the voltage on node 144 is provided to the gate of transistor 148 via op-amp input 152. If $V_{CTRL}$ is less than Vth, the current contribution to Iup from transistor 170 will be zero. To ensure that $V_{CTRL}$ is greater than Vth of transistor 148, the Iup current source is provided with a small current contribution Istatic. The current Istatic is provided by the current mirror circuit formed from current source 178 and transistors 180 and 182. The current Iup is equal to the sum of Istatic and Imain. Istatic is static and is not controlled by feedback. The signal NOT UP is 0, so transistor 122 is on and conducts the current Istatic to node 144, thereby charging $V_{CTRL}$ up past Vth. Because $V_{CTRL}$ is greater than Vth of transistor 148, the op-amp 158 works properly and provides feedback to transistor 170 in the Iup current source. The Iup current therefore tracks Irp, which in turn is controlled by the current mirror formed by source 176 and transistors TA and TD. To guarantee perfect current matching, the same amount of current (Istatic) is added to Irp using transistors 180 and 188.

As this discussion demonstrates, the current mirror circuitry of source 178 and transistors 180 and 182 forms a current source that provides a current Istatic that ensures that the feedback path 184 of charge pump 40 works properly at low values of $V_{CTRL}$. As a result, the value of $V_{CTRL}$ does not become stuck at a particular voltage level in situations in which $V_{CTRL}$ is less than Vth of transistor 148. The use of current mirror circuitry to provide Istatic is merely illustrative. Any suitable circuitry may be used in charge pump 40 to prevent non-startup problems from developing.

Path 186 represents a negative feedback path that is stable. Path 184, however, is a positive feedback path, and can serve as a potential source of noise feedback in pump 40. If noise appears on output 140, positive feedback through path 184 could potentially increase this noise level. Accordingly, charge pump 40 preferably includes filter circuitry 190 interposed in the feedback path between node 144 and the Iup current source. Filter circuitry 190 may be based on any suitable filter circuit for reducing noise feedback. In the illustrative example of FIG. 7, filter circuitry 190 includes a capacitor 192 and resistor 194 in a low-pass filter configuration. This configuration blocks high-frequency noise components in the feedback path 184 (e.g., at frequencies of about 10 MHz and higher in an illustrative circuit implementation) and prevents excessive noise from developing on line 140.

In typical implementations of charge pump 40 in an integrated circuit, layout asymmetries and other non-ideal factors may create a second-order current mismatch between Iup and Idn. This source of mismatch may be corrected by balancing the strengths of transistors 170 and TB.

Any suitable technique may be used to balance transistors 170 and TB. With one suitable approach, transistor 170 and/or transistor TB may be programmable, so that the relative strengths of transistors 170 and TB may be adjusted. By adjusting the strengths of transistor 170 and/or transistor TB during a setup balancing operation (e.g., at a manufacturer following testing), second order current mismatch effects can be compensated.

Figure 8:
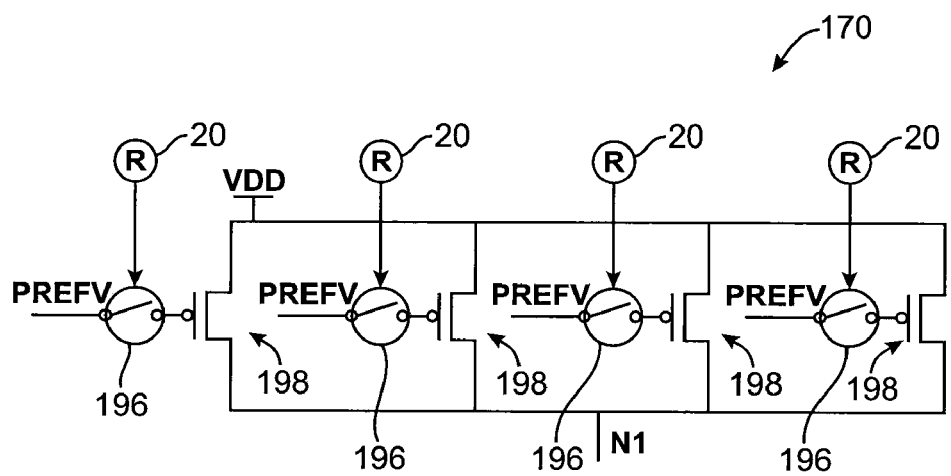
FIGS. 8 and 9 are diagrams of illustrative programmable transistors that may be used in the charge pump circuitry of FIG. 7 in accordance with the present invention.
Figure 9:
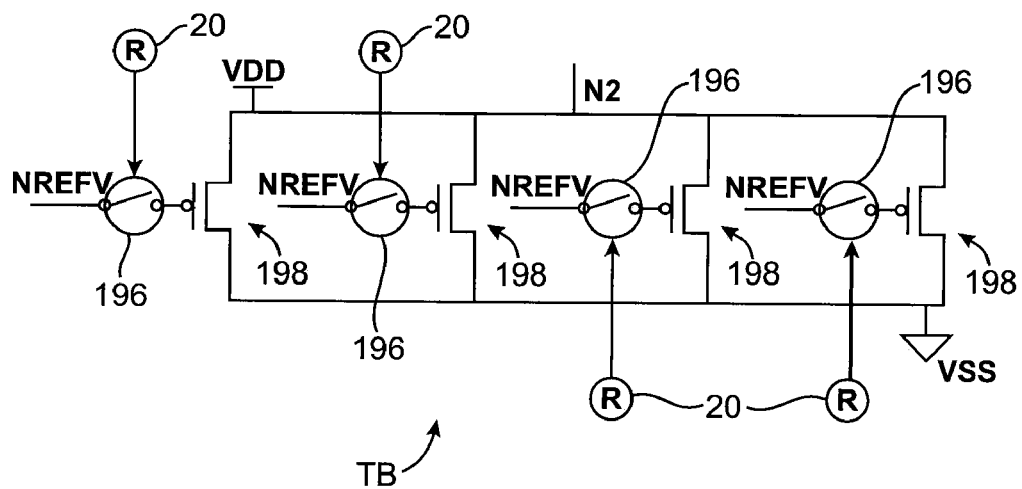

An illustrative programmable transistor 170 is shown in FIG. 8. An illustrative programmable transistor TB is shown in FIG. 9. As shown in FIGS. 8 and 9, the programmable transistors 170 and TB have multiple parallel controllable transistor stages. Each stage has a transistor 198 with a gate connected to a respective switch 196. Switches 196 may be formed, for example, by NMOS and/or PMOS transistors controlled by static control signals from programmable elements 20. The programmable elements 20 are loaded with configuration data that causes their outputs to produce the signals desired to turn on and off appropriate switches 196. This controls the associated stages of the programmable transistors 170 and TB by connecting and disconnecting the gates of various transistors 198 from the circuit. By producing control signals with programmable elements 20, the gate signals PREFV and NREFV are selectively applied only to certain selected subsets of the transistors 198 during operation. The other transistors are disconnected from transistor 170 (or TB) because their switches 196 are open. These programmable transistor adjustments are used to change the strengths of transistors 170 and TB to eliminate second-order current mismatch effects and thereby further minimize overall current mismatch in charge pump 40. Adjustments to the programmable transistors may be made at any suitable time such as when a manufacturer performs fabrication and testing operations in preparation for delivery of the programmable logic device to a customer.

The foregoing is merely illustrative of the principles of this invention and various modifications can be made by those skilled in the art without departing from the scope and spirit of the invention.

What is claimed is:

1. A charge pump circuit comprising:
   a charge pump core having first and second current sources and two circuit branches that are coupled by a unit-gain op-amp, wherein the charge pump core has an output node that is charged and discharged by the current sources to produce an output voltage in response to charge pump control signals;
   replica feedback circuitry coupled to the charge pump core that minimizes current mismatch between the first and second current sources, wherein at least one of the current sources comprises a programmable transistor having a plurality of parallel adjustable transistor stages; and
   a low-pass filter connected between the charge pump core and the replica feedback circuitry that reduces noise feedback at the output node.

2. The charge pump circuit defined in claim 1 further comprising:
   a static current source that prevents the output voltage at the output node from becoming stuck at a particular voltage level.

3. The charge pump circuit defined in claim 1 wherein the replica feedback circuitry comprises an operational amplifier having at least one metal-oxide-semiconductor transistor characterized by a threshold voltage and having a gate terminal, wherein the output node is connected to the gate terminal and wherein the charge pump circuit further comprises a static current source that contributes a static current to the first current source that prevents the output voltage at the output node from becoming stuck when the output voltage is less than the threshold voltage.

4. The charge pump circuit defined in claim 1 wherein the charge pump circuit is part of a programmable logic device integrated circuit that contains programmable elements, wherein the first and second current sources each have a current source input and each comprise a plurality of parallel metal-oxide-semiconductor transistors having respective gates and a plurality of associated switches, wherein each switch controls whether an associated one of the gates is connected to one of the current source inputs, and wherein the switches are controlled by switch control signals provided by the programmable elements.

5. The charge pump circuit defined in claim 1 wherein during charging of the output node the first current source produces a first current, wherein during discharging of the output node the second current produces a second current, wherein the replica feedback circuitry contains at least one current mirror circuit that produces a third current, and wherein the replica feedback circuitry provides feedback to the first and second current sources to ensure that the first current is equal to the third current during charging and that the second current is equal to the third current during discharging.

6. The charge pump circuit defined in claim 1 further comprising:
   a static current source that contributes a static current to the first current source that prevents the output voltage at the output node from becoming stuck at a particular voltage level.

7. A charge pump circuit comprising:
   a charge pump core having first and second current sources and two circuit branches that are coupled by a unit-gain op-amp, wherein the charge pump core has an output node that is charged and discharged by the current sources to produce an output voltage in response to charge pump control signals; and
   replica feedback circuitry coupled to the charge pump core that minimizes current mismatch between the first and second current sources, wherein at least one of the current sources comprises a programmable transistor having a plurality of parallel adjustable transistor stages, wherein the first current source contains at least one transistor having a gate that is part of a feedback path from the output node through the first current source back to the output node, the charge pump circuit further comprising a low pass filter having a capacitor connected between the gate and a source of positive voltage and a resistor connected to the gate in the feedback path.

8. A charge pump circuit comprising:
   a first current source electrically coupled to a positive voltage;
   a second current source electrically coupled to a ground voltage;
   first and second transistors in a first circuit branch between the first and second current sources;
   third and fourth transistors in a second circuit branch between the first and second current sources, wherein the first, second, third, and fourth transistors are controlled by charge pump control signals;
   a charge pump output node located between the first and second transistors in the first branch, wherein the output node has an output voltage and wherein the output node is either charged by the first current source to raise the output voltage or is discharged by the second current source to lower the output voltage in response to the charge pump control signals;
   a first operational amplifier connected in a unit gain configuration between the output node and a circuit node located between the third and fourth transistors, wherein the first operational amplifier electrically couples the first and second branches and prevents prevent charge sharing effects from affecting voltages at the output node when switching between charging and discharging;
   replica feedback circuitry that minimizes current mismatch between the first and second current sources, wherein at least one of the current sources comprises a programmable transistor having a plurality of parallel transistor stages that are selectively switched into use in response to static control signals produced by programmable elements, and wherein the first current source contains at least one transistor having a gate that is part of a feedback path from the output node through the first current source back to the output node, the charge pump circuit further comprising a low-pass filter interposed in the feedback path to reduce noise feedback along the feedback path.

9. The charge pump circuit defined in claim 8, wherein the first current source produces a first current, the charge pump circuit further comprising a source of a static current contribution to the first current, wherein the static current contribution charges the output node regardless of the output voltage to prevent the output voltage from becoming stuck at a particular level.

10. A method of adjusting a charge pump circuit on a programmable logic device to reduce current source current mismatch effects, wherein the charge pump circuit comprises a first current source having a first transistor and a second current source having a second transistor, wherein the first and second current sources are selectively used to either charge or discharge a charge pump output node to produce an output voltage, and wherein replica feedback circuitry is used to minimize first-order current mismatch between the first and second current sources, the method comprising:

loading programming data into programmable elements on the programmable logic device integrated circuit; and applying static control signals from the loaded programmable elements to the charge pump to adjust the first transistor's strength relative to the second transistor's strength, wherein the first transistor is part of a feedback path from the output node through the first current source back to the output node, the method further comprising using a low-pass filter in the feedback path to reduce noise feedback along the feedback path.

11. The method defined in claim 10 wherein the first transistor and second transistor are each programmable transistors having a plurality of parallel controllable transistor stages and wherein applying the static control signals comprises applying the static control signals to the controllable stages in the first transistor and the controllable stages in the second transistor.

12. The method defined in claim 10 wherein the charge pump circuit comprises replica feedback circuitry, the method further comprising using the replica feedback circuitry to reduce current mismatch between the first and second current sources.

13. The method defined in claim 10 further comprising providing a static current contribution to the first current source to prevent the output voltage from becoming stuck at certain voltage levels.

* * * * *